(12) United States Patent
Lim (10) Patent No.: US 9,197,167 B2
(45) Date of Patent: Nov. 24, 2015

(54) AMPLIFYING CIRCUIT AND TOUCH CONTROL SENSING SYSTEM

(71) Applicant: PixArt Imaging Inc., Hsin-Chu (TW)

(72) Inventor: Wooi Kip Lim, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 62 days.

(21) Appl. No.: 14/164,264

(22) Filed: Jan. 27, 2014

(65) Prior Publication Data
US 2015/0214899 A1 Jul. 30, 2015

(51) Int. Cl.
*H03F 1/26* (2006.01)
*G06F 3/044* (2006.01)
*H03F 1/02* (2006.01)
*H03F 3/45* (2006.01)

(52) U.S. Cl.
CPC *H03F 1/26* (2013.01); *G06F 3/044* (2013.01); *H03F 1/0272* (2013.01); *H03F 3/45475* (2013.01); *H03F 2200/372* (2013.01); *H03F 2203/45512* (2013.01); *H03F 2203/45528* (2013.01)

(58) Field of Classification Search
CPC ............. G06F 3/041–3/047; G06F 2203/04101–2203/04113
USPC ......... 345/173–178; 178/18.01–18.09, 18.11
See application file for complete search history.

(56) References Cited

U.S. PATENT DOCUMENTS

| | | | |
|---|---|---|---|
| 8,054,299 B2 * | 11/2011 | Krah | 345/174 |
| 8,610,443 B1 * | 12/2013 | Ryshtun et al. | 324/683 |
| 2009/0167720 A1 * | 7/2009 | Geaghan | 345/174 |
| 2010/0085325 A1 * | 4/2010 | King-Smith et al. | 345/174 |
| 2013/0278538 A1 * | 10/2013 | Brunet et al. | 345/174 |

* cited by examiner

*Primary Examiner* — Stephen Sherman
(74) *Attorney, Agent, or Firm* — Winston Hsu; Scott Margo (57) ABSTRACT

An amplifying circuit, which comprises: an amplifier, comprising a signal input terminal and a signal output terminal; a first current sinking module, for sinking a third current from the signal input terminal; and a noise sensing module, for sensing a output voltage level at the signal output terminal, for controlling the first current sinking module to sink the third current from the signal input terminal if the output voltage level is larger than a first high threshold value, and for controlling the first current sinking module not to sink the third current if the output voltage level is smaller than the first high threshold value.

12 Claims, 9 Drawing Sheets

AMPLIFYING CIRCUIT AND TOUCH CONTROL SENSING SYSTEM

BACKGROUND OF THE INVENTION

1. Field of the Invention

The present invention relates to an amplifying circuit and a touch control sensing system, and particularly relates to an amplifying circuit and a touch control sensing system which can suppress noise.

2. Description of the Prior Art

A touch control sensing system is applied to various kinds of electronic apparatuses, for example, a mobile phone, a tablet pc or a notebook. Many sensing mechanisms can be applied to the touch control sensing system for sensing a touch operation, for example, resistive sensing, capacitive sensing, or optical sensing.

Figure 1:
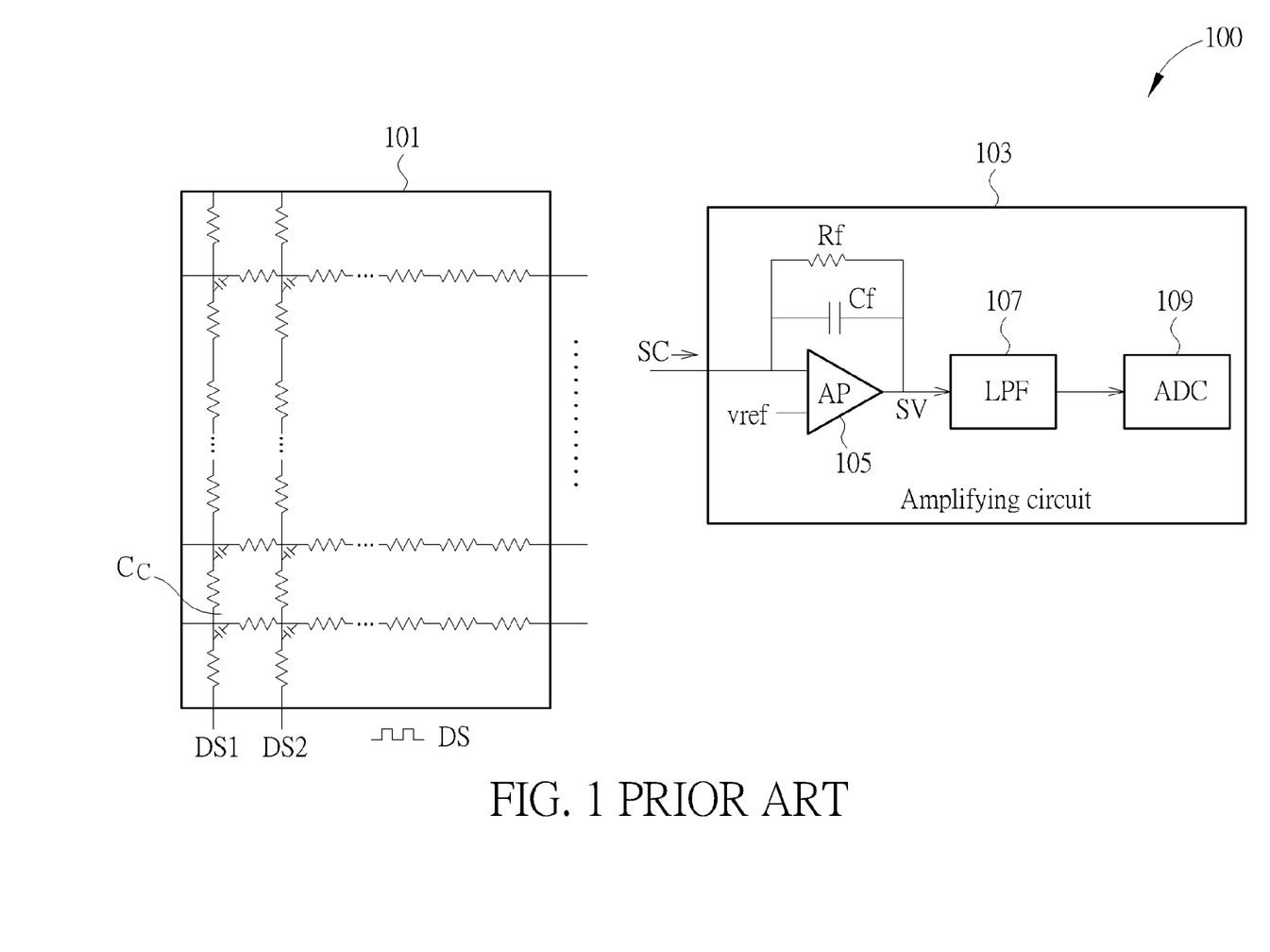
FIG. 1 is a conventional touch control sensing system.

FIG. 1 is a conventional touch control sensing system 100. The touch control sensing system 100 comprises a touch panel 101 utilizing capacitive sensing, and an amplifying circuit 103. Many devices are not illustrated here for the convenience for explaining. In such system, the drive clock DS is inputted to the touch panel 101 and will be pulsed during touch scanning. A current (i.e. a sensing current signal SC) will be generated during positive edge or negative edge of the drive clock DS.

The amplifying circuit 103 comprises an amplifier 105, a low pass filter 107 (ex. an anti alias filter), and an analog to digital converter 109. The sensing current signal SC will be picked up by the amplifier 105 to generate a sensing voltage signal SV to the low pass filter 107. The output of the low pass filter 107 will feed into the analog to digital converter 109 to convert to digital signal for further process. If an object such as a finger touches on touch panel 101, a capacitor between the object and the touch panel 101 will be generated. In such situation, partial of the sensing current signal SC generated by the drive clock DS will be absorbed by the amplifying capacitor Cf. Therefore, the sensing voltage signal SV decreases and it is determined that the "touch" is sensed.

Normally the cell capacitance Cc in the touch panel 101 is around 3 pf, thus the output of the amplifier 105 equals to Vdrv*(3 p/Cf). Vdrv indicates a drive voltage of the drive clock DS. However, no matter what electronic apparatus is the touch control sensing system 100 applied to, noise like common mode ground may disturb the capacitive touch performance. For example, if high amplitude noise exists, the sensing voltage signal SV may increase and get saturated. In such case, the sensing voltage signal SV equals to Vdrv*(3 pF/Cf)+Vnoise*(Cnoise/Cf). Cnoise indicates undesired capacitance such as the capacitance generated by the circuit. In order to suppress the noise, the capacitance of the amplifying capacitor Cf must be set to higher value. However, the amplifying capacitor Cf with higher capacitance causes a lower gain for the amplifier 105. Also, the amplifying capacitor Cf with higher capacitance increases the chip size and reduces the SNR (Signal to Noise Ratio) since the signal is also suppressed if the amplifying capacitor Cf has high capacitance.

Some techniques are developed to acquire a better SNR. For example, 128 data are collected per clock cycle for the drive clock to decide if the "touch" occurs or not. However, such operation need 32 drive clocks and each clock needs to be sampled 4 times per clock cycle, to generate 128 samples. Such method not only needs high report rate but also consumes more power.

SUMMARY OF THE INVENTION

Therefore, one objective of the present invention is to provide an amplifying circuit with noise suppressing mechanism.

Another objective of the present invention is to provide a touch control sensing system with noise suppressing mechanism.

One embodiment of the present invention discloses an amplifying circuit, which comprises: an amplifier, comprising a signal input terminal and a signal output terminal; a first current providing module, for providing a first current to the signal input terminal; and a noise sensing module, for sensing a output voltage level from the signal output terminal, for controlling the first current providing module to provide the first current if the output voltage level is less than a first low threshold value, and for controlling the first current providing module not to provide the first current if the output voltage level is larger than the first low threshold value.

Another embodiment of the present invention discloses an amplifying circuit, which comprises: an amplifier, comprising a signal input terminal and a signal output terminal; a first current sinking module, for sinking a third current from the signal input terminal; and a noise sensing module, for sensing a output voltage level at the signal output terminal, for controlling the first current sinking module to sink the third current from the signal input terminal if the output voltage level is larger than a first high threshold value, and for controlling the first current sinking module not to sink the third current if the output voltage level is smaller than the first high threshold value.

The other embodiments of the present invention disclose touch control sensing systems comprising the above-mentioned amplifying circuits to amplify a touch sensing signal. The operations are similar thus are omitted for brevity here.

In view of above-mentioned embodiments, the noise can be suppressed even if the amplifier is a charge amplifier having an amplifying capacitor with low capacitance or the amplifier does not scan much data. By this way, the size for the chip can be reduced and the power consumption can be decreased.

These and other objectives of the present invention will no doubt become obvious to those of ordinary skill in the art after reading the following detailed description of the preferred embodiment that is illustrated in the various figures and drawings.

DETAILED DESCRIPTION

FIG. 2-FIG. 6 are block diagrams illustrating an amplifying circuit according to embodiments of the present application. Please note in the following embodiments, it is assumed that the amplifying circuit is applied to the touch control sensing system shown in FIG. 1, but the amplifying circuit can be applied to other electronic devices. Additionally, in the following embodiments the amplifier is a differential amplifier to amplify the difference between the input signal for the amplifier and a reference output voltage level. Also, the amplifier for the following embodiments can be the charger amplifier 105 shown in FIG. 1. In such case, the amplifier can comprise the amplifying resistor Rf and the amplifying capacitor Cf, which are not illustrated in the following embodiments.

Figure 2:
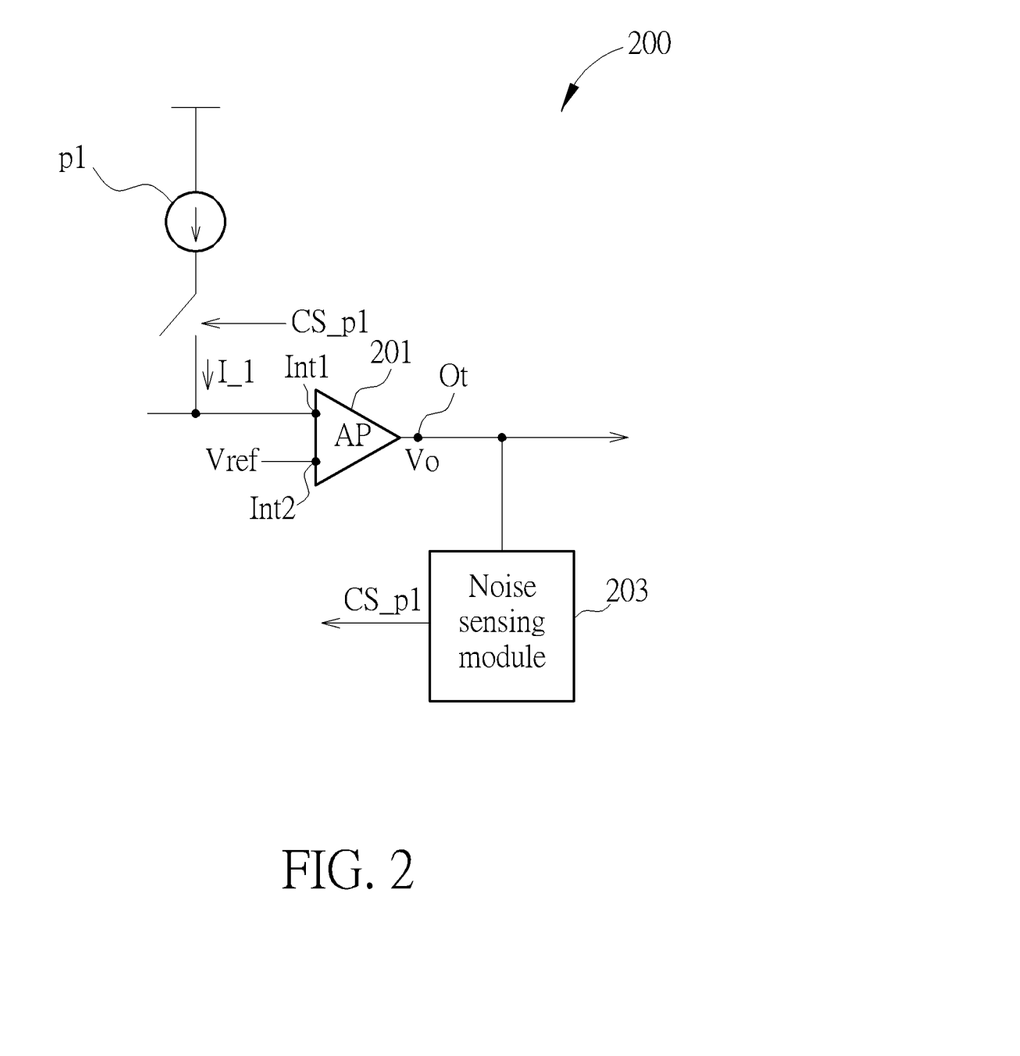
FIG. 2-FIG. 6 are block diagrams illustrating an amplifying circuit according to embodiments of the present application.

As shown in FIG. 2, the amplifying circuit 200 comprises an amplifier 201, a noise detecting module 203, and a first current providing module p1. The amplifier 201 comprises a signal input terminal Int1 receiving an input signal (ex. sensing current signal SC in FIG. 1), and a signal output terminal Ot. The noise sensing module 203 senses an output voltage level Vo at the signal output terminal Ot (ex. the sensing voltage signal SV in FIG. 1), and controls the first current providing module p1 to provide a first current I_1 if the output voltage level Vo is less than a first low threshold value (Vtl1 in FIG. 7), and controls the first current providing module P1 not to provide the first current I_1 if the output voltage level Vo is larger than the first low threshold value, via the control signal CS_p1. By this way, the output voltage level Vo can be raised if it is too low due to the noise.

Figure 3:
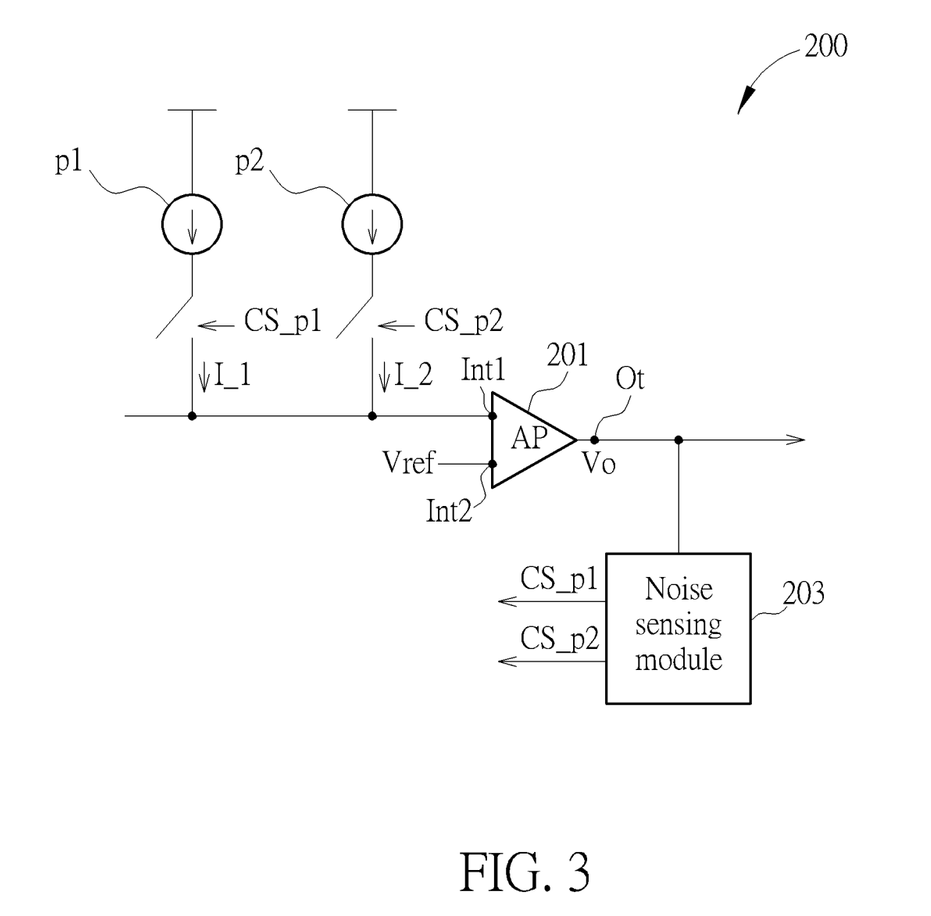

However, if the output voltage level at the output terminal Ot is extremely low, the current I_1 may be non-enough to pull up the output voltage level Vo. Therefore, a second current providing module p2 can be provided, as shown in FIG. 3. The noise sensing module 203 controls the second current providing module p2 to provide the second current I_2 and the first current providing module p1 to provide the first current I_1 if the output voltage level Vo is lower than a second low threshold value (ex. Vtl2 in FIG. 7) smaller than the first low threshold value Vtl1, and controls the second current providing module p2 not to provide the second current I_2 if the output voltage level Vo is between the first low threshold value and the second low threshold value. By this way, the power for raising the output voltage level Vo can be stronger.

Figure 4:
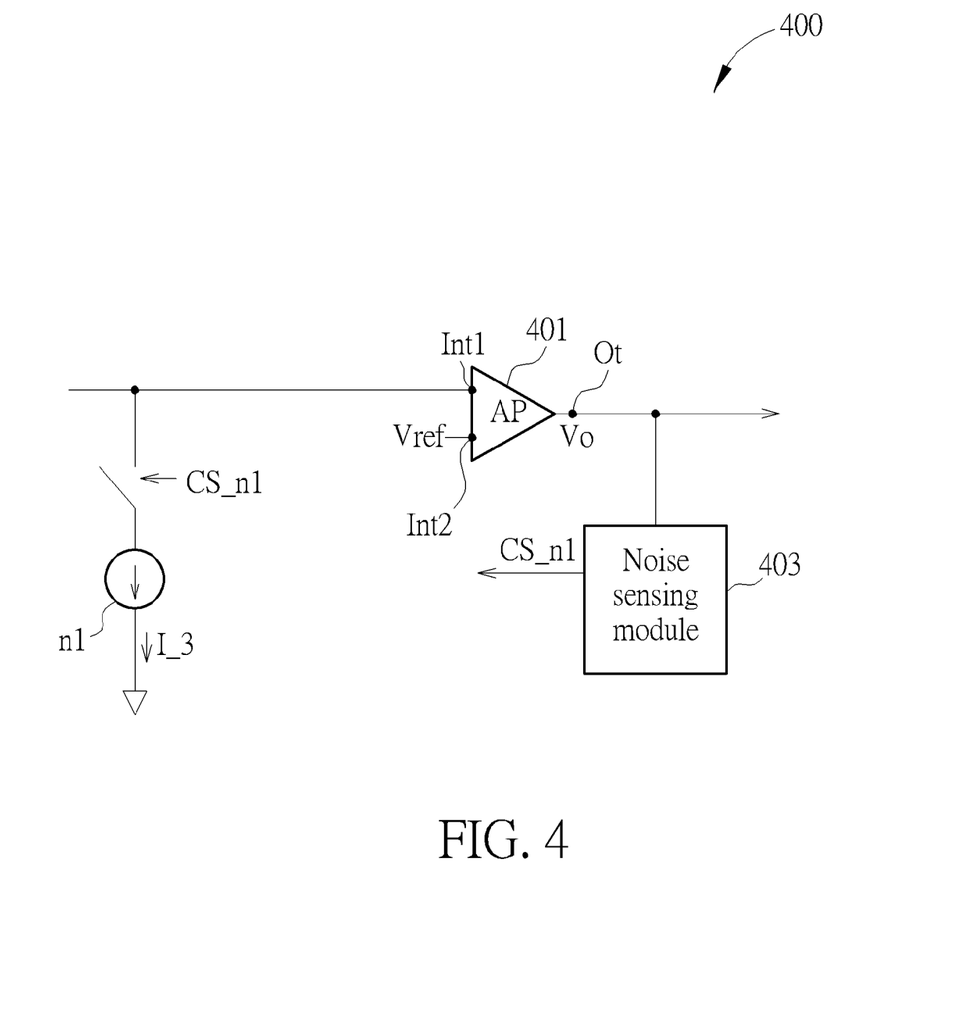

In the embodiment of FIG. 4, the amplifying circuit 400 comprises an amplifier 401, a noise detecting module 403, and a first current sinking module n1. The noise sensing module 403 controls the first current sinking module n1 to sink the third current I_3 from the signal input terminal Int1 if the output voltage level Vo is larger than a first high threshold value (ex. Vth1 in FIG. 7), and controls the first current sinking module 403 not to sink the third current I_3 if the output voltage level is smaller than the first high threshold value. By this way, the output voltage level Vo can be decreased if the output voltage level Vo is too high due to the noise.

Figure 5:
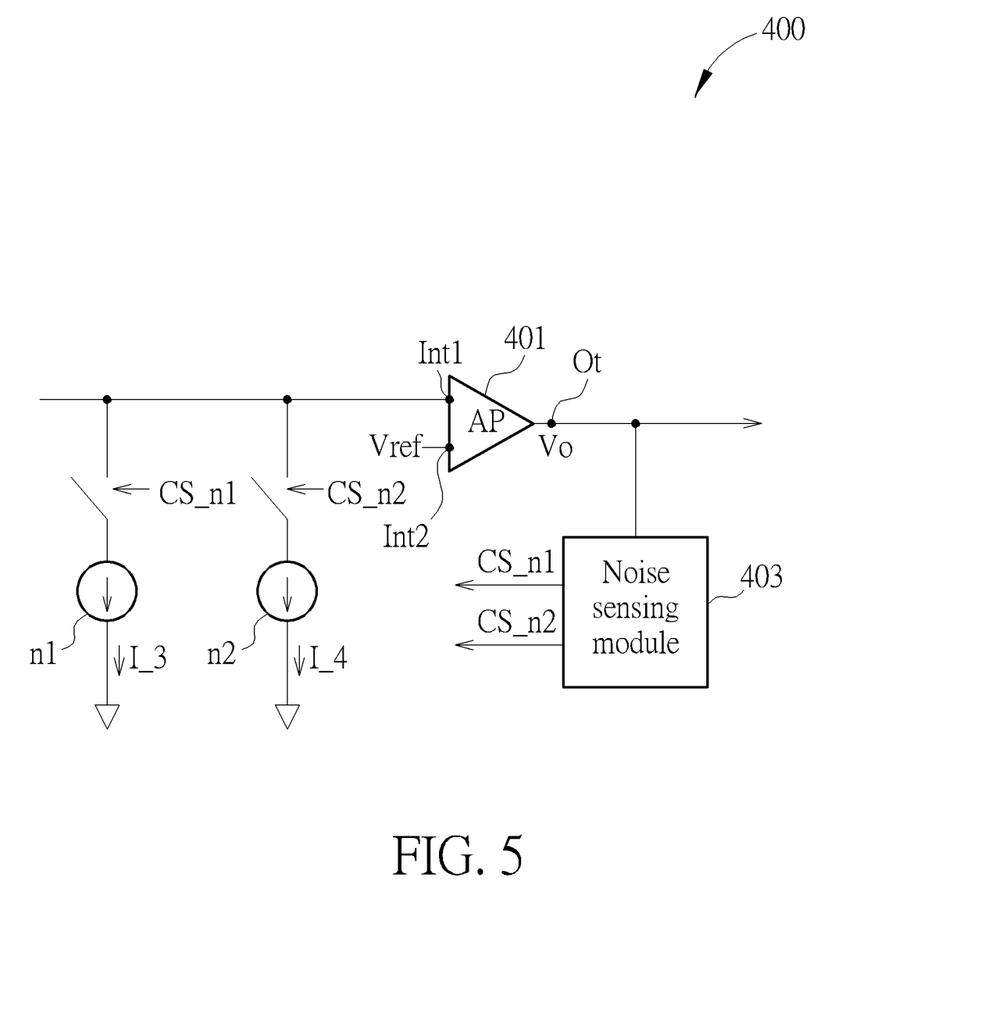

However, if the output voltage level Vo at the output terminal Ot is extremely high, the third current I_3 may be non-enough to pull down the output voltage level. Therefore, a second current sinking module n2 can be provided, as shown in FIG. 5. The noise sensing module 403 controls the second current sinking module n2 to sink a fourth current I_4 and the first current sinking module n1 to sink the third current I_3 if the output voltage level Vo is higher than a second low threshold value (ex. Vth2 in FIG. 7) larger than the first high threshold value Vth1, and controls the second current sinking module n2 not to sink the fourth current I_4 if the output voltage level is between the first high threshold value and the second high threshold value. By this way, the power for pulling the output voltage level Vo can be stronger.

Figure 6:
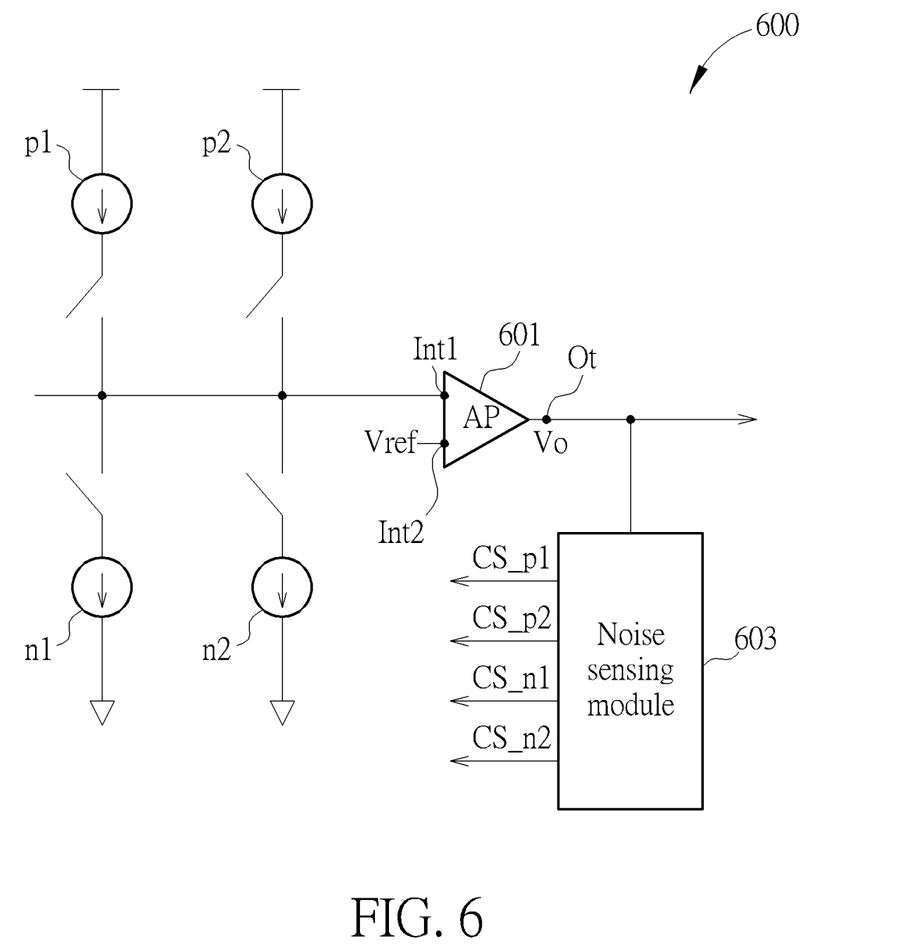

In the embodiment of FIG. 6, the amplifying circuit 600 comprises an amplifier 601, a noise detecting module 603, a first current providing module p1, a second current providing module p2, a first current sinking module n1, and a second current sinking module n2. The first current providing module p1, the second current providing module p2, the first current sinking module n1, and the second current sinking module n2 can be controlled as the embodiments shown in FIG. 2-FIG. 6, via the control signals CS_p1, CS_p2, CS_n1, CS_n2. Thus the operation for the embodiment in FIG. 6 is omitted for brevity here.

In view of above-mentioned embodiments, the amplifying circuit of the present invention can comprise various combinations of the current providing/sinking modules to pull up/pull down the output voltage Vo. The combination can be, for example, only n1, n1+n2, only p1, only p2, n1+p1, n1+n2+p1+p2, or any other combination that is not illustrated here.

Figure 7:
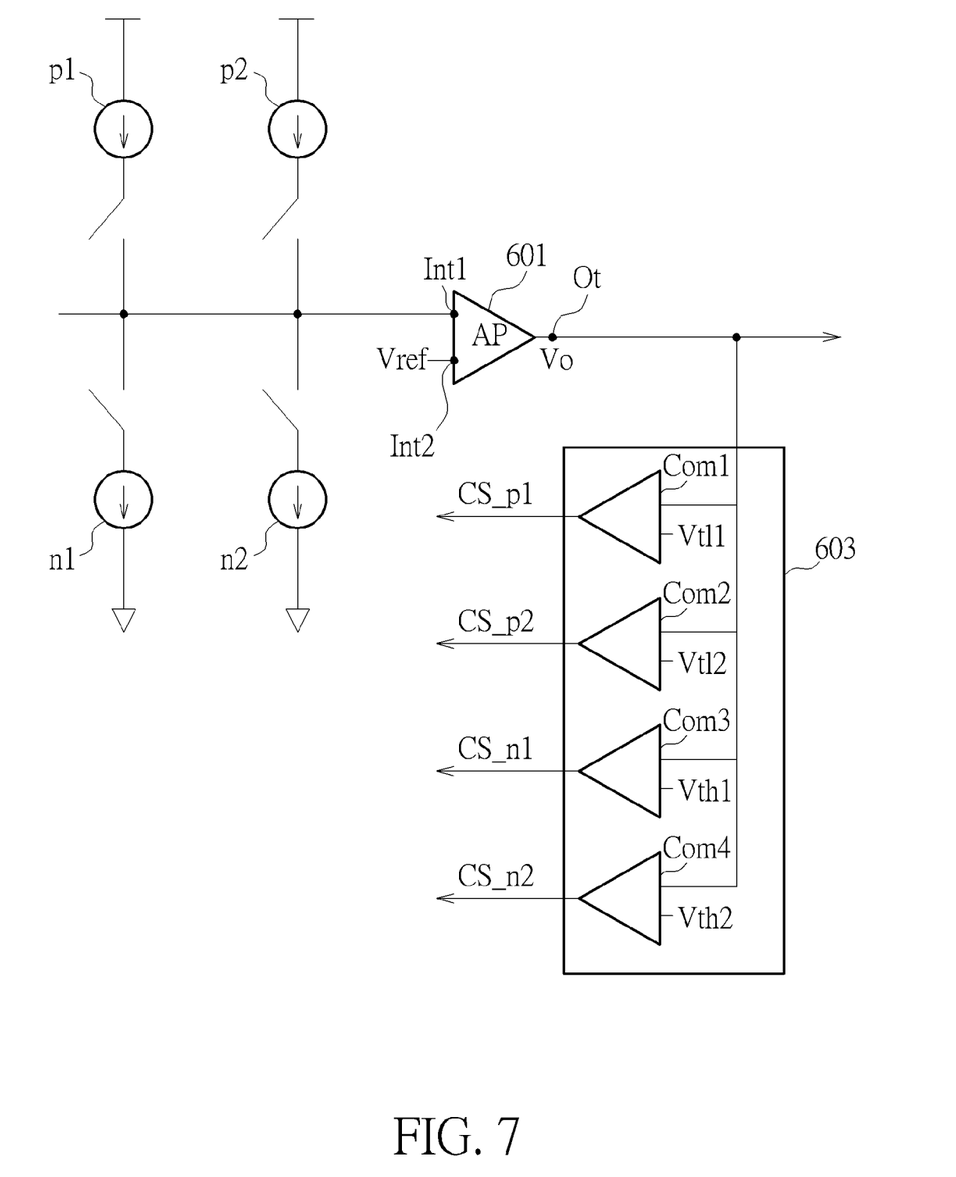
FIG. 7 is a circuit diagram illustrating a more detail structure for the amplifying circuit shown in FIG. 2.

FIG. 7 is a circuit diagram illustrating a more detail structure for the amplifying circuit shown in FIG. 6. Please note the circuit in FIG. 6 is taken for example in FIG. 7, but the circuit structure in FIG. 7 can be applied to other embodiments. As shown in FIG. 7, the noise sensing module 603 comprises comparators Com1, Com2, Com3 and Com4 which respectively to compare the output voltage level Vo with the first low threshold value Vtl1, the second low threshold value Vtl2, the first high threshold value Vth1, and the second high threshold value Vth2. By this way, the control signals CS_p1, CS_p2, CS_n1 and CS_n2 can be generated according to the output voltage level Vo.

Figure 8:
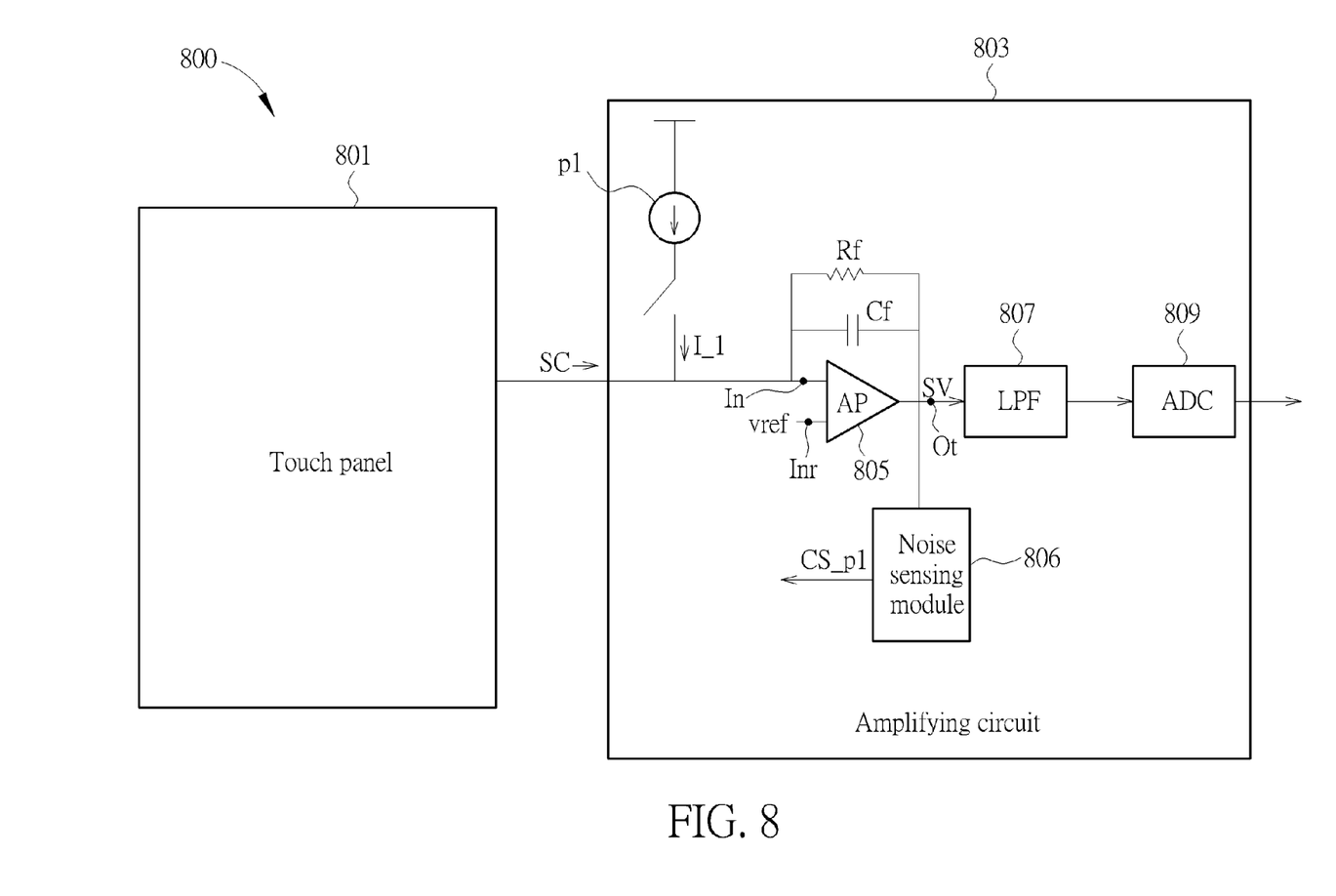
FIG. 8 is a circuit diagram illustrating a touch control sensing system according to one embodiment of the present invention.

If the amplifying circuit is applied to a touch control sensing system shown in FIG. 1, a touch control sensing system according to one embodiment of the present invention is acquired. FIG. 8 is a circuit diagram illustrating a touch control sensing system according to one embodiment of the present invention. The touch control sensing system 800 comprises a touch panel 801 and an amplifying circuit 803. The touch panel 801 generates a touch sensing signal (ex. the sensing current signal SC). The amplifying circuit 803 comprises: an amplifier 805, a first current providing module p1, and a noise sensing module 806. The amplifier 805 comprises a signal input terminal In, a reference voltage receiving terminal Inr and a signal output terminal Ot. The signal input terminal In receives the touch sensing signal, and the reference voltage receiving terminal receives a reference voltage Vref. The amplifier 805 generates a touch determining signal (i.e. the sensing voltage signal SV) according to a difference between a voltage level of the touch sensing signal and the reference voltage Vref. The noise sensing module 806 senses the voltage level for the touch determining signal, controls the first current providing module p1 to provide the first current I_1 if the voltage level for the touch determining signal is less than a first low threshold value, and controls the first current providing module 806 not to provide the first current I_1 if the voltage level for the touch determining signal is larger than the first low threshold value.

Other combinations for the current providing module/current sinking module can also be applied to the touch control sensing system shown in FIG. 8, the operations and structures thereof are omitted for brevity here since the related explanation has been detailedly illustrated.

Figure 9:
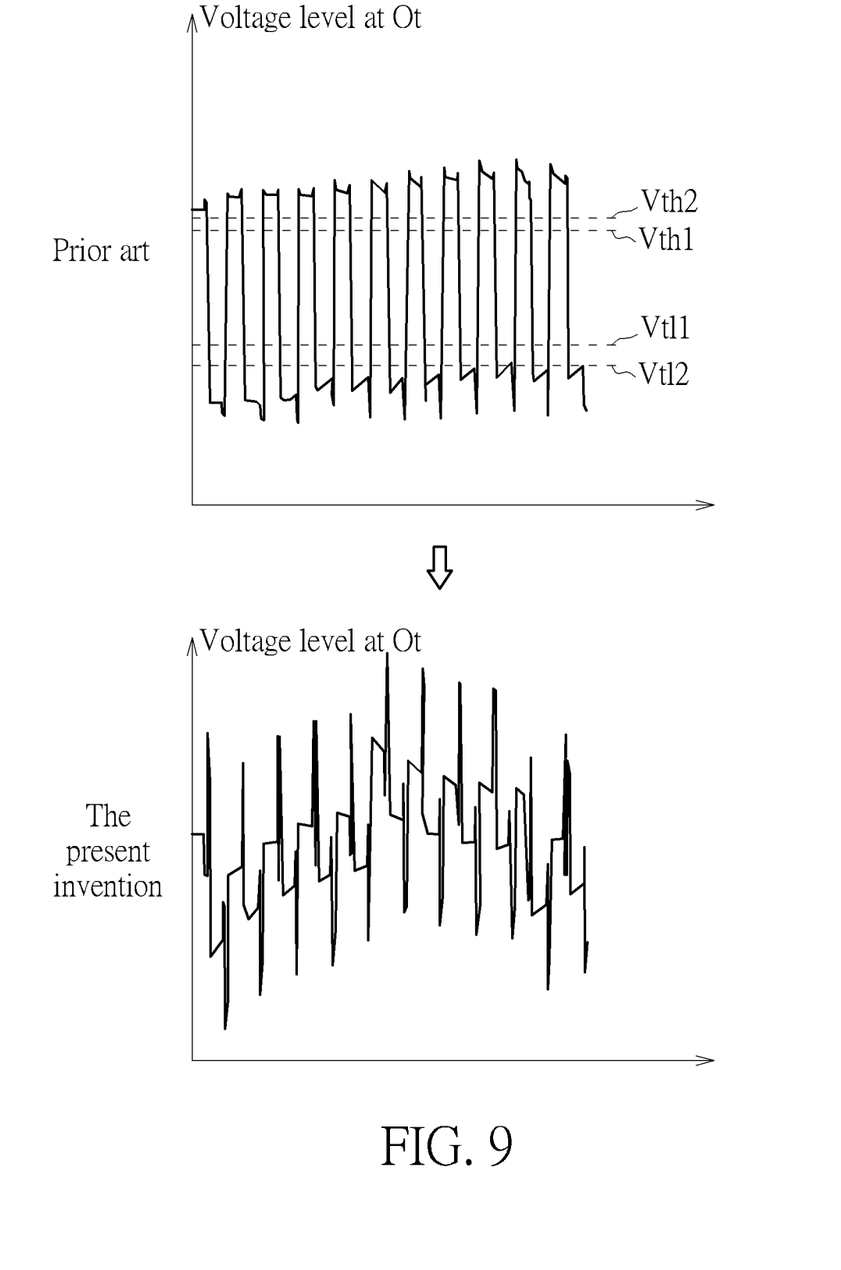
FIG. 9 is a schematic diagram illustrating how the noise is suppressed via the embodiments of the present invention.

FIG. 9 is a schematic diagram illustrating how the noise is suppressed via the embodiments of the present invention. As shown in FIG. 9, the output voltage level Vo in the prior art has a wide range due to the noise. After processed by the circuit provided by the present invention, the signals lower than the first low threshold value Vtl1, the second low threshold value Vtl2, and higher than the first high threshold value Vth1 and the second high threshold value Vth2 can be cut. Accordingly, the noise can be suppressed even if the amplifier is a charge amplifier having an amplifying capacitor with low capacitance or the amplifier does not scan much data. By this way, the size for the chip can be reduced and the power consumption can be decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifying circuit, comprising:
   an amplifier, comprising a signal input terminal and a signal output terminal;
   a first current providing module, for providing a first current to the signal input terminal;
   a noise sensing module, for sensing a output voltage level from the signal output terminal, for controlling the first current providing module to provide the first current if the output voltage level is less than a first low threshold value, and for controlling the first current providing module not to provide the first current if the output voltage level is larger than the first low threshold value; and
   a second current providing module, for providing a second current to the signal input terminal;
   wherein the noise sensing module controls the second current providing module to provide the second current and the first current providing module to provide the first current if the output voltage level is less than a second low threshold value smaller than the first low threshold value, and controls the second current providing module not to provide the second current if the output voltage level is between the first low threshold value and the second low threshold value.

2. The amplifying circuit of claim 1, further comprising:
   a first current sinking module, for sinking a third current from the signal input terminal; and
   wherein the noise sensing module controls the first current sinking module to sink the third current from the signal input terminal if the output voltage level is larger than a first high threshold value, and controls the first current sinking module not to sink the third current if the output voltage level is smaller than the first high threshold value.

3. The amplifying circuit of claim 2, further comprising:
   a second current sinking module, for sinking a fourth current from the signal input terminal; and
   wherein the noise sensing module controls the first current sinking module to sink the third current from the signal input terminal and controls the second current sinking module to sink the fourth current from the signal input terminal if the output voltage level is larger than a second high threshold value larger than the first high threshold value, and controls the second current sinking module not to sink the fourth current if the output voltage level is between the first high threshold value and the second high threshold value.

4. The amplifying circuit of claim 1, further comprising:
   an amplifying resistor, comprising a first terminal coupled to the signal input terminal and comprising a second terminal coupled to the signal output terminal; and
   an amplifying capacitor, comprising a first terminal coupled to the signal input terminal and comprising a second terminal coupled to the signal output terminal;
   wherein the amplifier further comprises a reference voltage receiving terminal for receiving a reference voltage and outputs an output signal according to a difference between a signal received at the signal input terminal.

5. An amplifying circuit, comprising:
   an amplifier, comprising a signal input terminal and a signal output terminal;
   a first current sinking module, for sinking a third current from the signal input terminal;
   a noise sensing module, for sensing a output voltage level at the signal output terminal, for controlling the first current sinking module to sink the third current from the signal input terminal if the output voltage level is larger than a first high threshold value, and for controlling the first current sinking module not to sink the third current if the output voltage level is smaller than the first high threshold value; and
   a second current sinking module, for sinking a fourth current from the signal input terminal;
   wherein the noise sensing module controls the first current sinking module to sink the third current from the signal input terminal and controls the second current sinking module to sink the fourth current from the signal input terminal if the output voltage level is larger than a second high threshold value larger than the first high threshold value, and controls the second current sinking module not to sink the fourth current if the output voltage level is between the first high threshold value and the second high threshold value.

6. A touch control sensing system, comprising:
   a touch panel, for generating a touch sensing signal;
   an amplifying circuit, comprising:
      an amplifier, comprising a signal input terminal, a reference voltage receiving terminal and a signal output terminal, wherein the signal input terminal receives the touch sensing signal, the reference voltage receiving terminal receives a reference voltage, where the amplifier generates a touch determining signal according to a difference between a voltage level of the touch sensing signal and the reference voltage;
      a first current providing module, for providing a first current to the signal input terminal; and
      a noise sensing module, for sensing the voltage level for the touch determining signal, for controlling the first current providing module to provide the first current if the voltage level for the touch determining signal is less than a first low threshold value, and for controlling the first current providing module not to provide the first current if the voltage level for the touch determining signal is larger than the first low threshold value; and
   a second current providing module, for providing a second current to the signal input terminal;
   wherein the noise sensing module controls the second current providing module to provide the second current and the first current providing module to provide the first current if the voltage level for the touch determining signal is less than a second low threshold value smaller than the first low threshold value, and controls the second current providing module not to provide the second current if the voltage level for the touch determining signal is between the first low threshold value and the second low threshold value.

7. The touch control sensing system of claim 6, further comprising:
   a first current sinking module, for sinking a third current from the signal input terminal; and
   wherein the noise sensing module controls the first current sinking module to sink the third current from the signal input terminal if the voltage level for the touch determining signal is larger than a first high threshold value, and controls the first current sinking module not to sink the third current if the voltage level for the touch determining signal is smaller than the first high threshold value.

8. The touch control sensing system of claim 7, further comprising:
a second current sinking module, for sinking a fourth current from the signal input terminal; and
wherein the noise sensing module controls the first current sinking module to sink the third current from the signal input terminal and controls the second current sinking module to sink the fourth current from the signal input terminal if the voltage level for the touch determining signal is larger than a second high threshold value larger than the first high threshold value, and controls the second current sinking module not to sink the fourth current if the voltage level for the touch determining signal is between the first high threshold value and the second high threshold value.

9. The touch control sensing system of claim 6, further comprising:
a resistor, comprising a first terminal coupled to the signal input terminal and comprising a second terminal coupled to the signal output terminal; and
a capacitor, comprising a first terminal coupled to the signal input terminal and comprising a second terminal coupled to the signal output terminal.

10. A touch control sensing system, comprising:
a touch panel, for generating a touch sensing signal;
an amplifying circuit, comprising:
an amplifier, comprising a signal input terminal, a reference voltage receiving terminal and a signal output terminal, wherein the signal input terminal receives the touch sensing signal, the reference voltage receiving terminal receives a reference voltage, where the amplifier generates a touch determining signal according to a difference between a voltage level of the touch sensing signal and the reference voltage;
a first current sinking module, for sinking a third current from the signal input terminal; and
a noise sensing module, for sensing the voltage level for the touch determining signal, for controlling the first current sinking module to sink the third current if the voltage level for the touch determining signal is larger than a first high threshold value, and for controlling the first current sinking module not to sink the third current if the voltage level for the touch determining signal is smaller than the first high threshold value; and
a second current sinking module, for sinking a fourth current from the signal input terminal;
wherein the noise sensing module controls the first current sinking module to sink the third current from the signal input terminal and controls the second current sinking module to sink the fourth current from the signal input terminal if the voltage level for the touch determining signal is larger than a second high threshold value larger than the first high threshold value, and controls the second current sinking module not to sink the fourth current if the voltage level for the touch determining signal is between the first high threshold value and the second high threshold value.

11. An amplifying circuit, comprising:
an amplifier, comprising a signal input terminal and a signal output terminal;
a first current providing module, for providing a first current to the signal input terminal;
a noise sensing module, for sensing a output voltage level from the signal output terminal, for controlling the first current providing module to provide the first current if the output voltage level is less than a first low threshold value, and for controlling the first current providing module not to provide the first current if the output voltage level is larger than the first low threshold value;
a first current sinking module, for sinking a third current from the signal input terminal; and
a second current sinking module, for sinking a fourth current from the signal input terminal;
wherein the noise sensing module controls the first current sinking module to sink the third current from the signal input terminal if the output voltage level is larger than a first high threshold value, and controls the first current sinking module not to sink the third current if the output voltage level is smaller than the first high threshold value;
wherein the noise sensing module controls the first current sinking module to sink the third current from the signal input terminal and controls the second current sinking module to sink the fourth current from the signal input terminal if the output voltage level is larger than a second high threshold value larger than the first high threshold value, and controls the second current sinking module not to sink the fourth current if the output voltage level is between the first high threshold value and the second high threshold value.

12. A touch control sensing system, comprising:
a touch panel, for generating a touch sensing signal;
an amplifying circuit, comprising:
an amplifier, comprising a signal input terminal, a reference voltage receiving terminal and a signal output terminal, wherein the signal input terminal receives the touch sensing signal, the reference voltage receiving terminal receives a reference voltage, where the amplifier generates a touch determining signal according to a difference between a voltage level of the touch sensing signal and the reference voltage;
a first current providing module, for providing a first current to the signal input terminal; and
a noise sensing module, for sensing the voltage level for the touch determining signal, for controlling the first current providing module to provide the first current if the voltage level for the touch determining signal is less than a first low threshold value, and for controlling the first current providing module not to provide the first current if the voltage level for the touch determining signal is larger than the first low threshold value;
a first current sinking module, for sinking a third current from the signal input terminal; and
a second current sinking module, for sinking a fourth current from the signal input terminal;
wherein the noise sensing module controls the first current sinking module to sink the third current from the signal input terminal if the voltage level for the touch determining signal is larger than a first high threshold value, and controls the first current sinking module not to sink the third current if the voltage level for the touch determining signal is smaller than the first high threshold value;
wherein the noise sensing module controls the first current sinking module to sink the third current from the signal input terminal and controls the second current sinking module to sink the fourth current from the signal input terminal if the voltage level for the touch determining signal is larger than a second high threshold value larger than the first high threshold value, and controls the second current sinking module not to sink the fourth current if the voltage level for the touch determining signal is between the first high threshold value and the second high threshold value.

* * * * *